(12) United States Patent
Choe et al.

(10) Patent No.: US 12,598,704 B2
(45) Date of Patent: Apr. 7, 2026

(54) APPARATUS AND METHOD FOR MANUFACTURING POWER MODULE

(71) Applicant: HYUNDAI MOBIS CO., LTD., Seoul (KR)

(72) Inventors: Chan Yang Choe, Seoul (KR); Min Ki Kim, Yongin-si (KR)

(73) Assignee: Hyundai Mobis Co., Ltd., Seoul (KR)

( * ) Notice: Subject to any disclaimer, the term of this patent is extended or adjusted under 35 U.S.C. 154(b) by 157 days.

(21) Appl. No.: 18/441,334

(22) Filed: Feb. 14, 2024

(65) Prior Publication Data

US 2024/0306304 A1     Sep. 12, 2024

(30) Foreign Application Priority Data

Mar. 8, 2023     (KR) ........................ 10-2023-0030522

(51) Int. Cl.
| | |
|---|---|
| *H05K 1/181* | (2026.01) |
| *H05K 3/00* | (2006.01) |
| *H05K 3/06* | (2006.01) |
| *H10W 44/00* | (2026.01) |
| *H10W 70/05* | (2026.01) |
| *H10W 90/00* | (2026.01) |

(52) U.S. Cl.
CPC ........... *H05K 1/181* (2013.01); *H05K 3/0073* (2013.01); *H05K 3/06* (2013.01); *H10W 44/401* (2026.01); *H10W 70/093* (2026.01); *H10W 90/701* (2026.01); *H05K 2201/10022* (2013.01); *H05K 2201/10522* (2013.01); *H05K 2203/0323* (2013.01); *H05K 2203/1316* (2013.01)

(58) Field of Classification Search
CPC .... H05K 1/18; H05K 1/181–187; H05K 1/11; H05K 1/14; H05K 3/06; H05K 3/0073; H01L 21/4846; H01L 21/4853; H01L 23/498; H01L 23/49811; H01L 23/49844; H01L 23/49877; H01L 23/3121
USPC ........ 361/736–737, 763–766, 782–784, 816, 361/818, 813; 174/520; 257/780–790
See application file for complete search history.

(56) References Cited

U.S. PATENT DOCUMENTS

| | | | | |
|---|---|---|---|---|
| 4,410,867 | A * | 10/1983 | Arcidiacono .......... | H10D 86/85 257/532 |
| 4,830,878 | A * | 5/1989 | Kaneko .................. | H10D 86/85 338/308 |
| 5,122,929 | A * | 6/1992 | Palanisamy ....... | H01L 23/49838 361/779 |
| 7,259,077 | B2 * | 8/2007 | Degani .................... | H10D 1/47 257/E27.071 |

(Continued)

*Primary Examiner* — Tuan T Dinh
(74) *Attorney, Agent, or Firm* — NSIP Law

(57)     ABSTRACT

An apparatus and method for manufacturing a power module is provided. The power module includes: a circuit board having a metal pattern formed thereon; a terminal coupled to the circuit board and electrically connected to at least a portion of the metal pattern; a power device chip bonded to the circuit board and electrically connected to at least a portion of the metal pattern and the terminal; and a molding part covering the power device chip and the circuit board. The circuit board includes: a base part comprising an insulating material; a pattern layer disposed on at least one of an upper surface and a lower surface of the base part and providing the metal pattern; and a thin film resistor having a predetermined circuit pattern connecting the metal patterns disposed on the base part to each other.

14 Claims, 8 Drawing Sheets

(56) References Cited

U.S. PATENT DOCUMENTS

| | | | | |
|---|---|---|---|---|
| 7,691,747 | B2* | 4/2010 | Lin | .................... H01L 23/3114 |
| | | | | 257/E21.597 |
| 2005/0004442 | A1* | 1/2005 | Ozaki | ............. G01N 33/48707 |
| | | | | 600/407 |
| 2020/0183511 | A1* | 6/2020 | Frescas | ................... H02N 1/04 |
| 2021/0320063 | A1* | 10/2021 | Lin | ...................... H01L 25/043 |

* cited by examiner (Related Art)

(a)

(b)

310

300

APPARATUS AND METHOD FOR MANUFACTURING POWER MODULE

CROSS-REFERENCE TO RELATED APPLICATION(S)

This application claims priority under 35 U.S.C. § 119 to Korean Patent Application No. 10-2023-0030522, filed on Mar. 8, 2023, in the Korean Intellectual Property Office, the disclosure of which is incorporated herein by reference in its entirety.

BACKGROUND

1. Field

The following disclosure relates to an apparatus and a method for manufacturing a power module, and more particularly, to a structure of a power module that has neither a separate resistor nor a chip having a built-in resistor on a circuit board, and a method for manufacturing a power module.

2. Description of Related Art

A power semiconductor may be a semiconductor functioning to convert, disassemble, and manage power supplied to an electronic device by including a power switching device for power and a control integrated circuit (IC). The power semiconductor may require high pressure durability and high reliability compared to a general semiconductor, and there is an increasing demand for the power semiconductor due to the development of a hybrid vehicle, an electric vehicle, or the like.

A power module used for the hybrid vehicle or the electric vehicle may include a power semiconductor device used to convert a direct current (DC) to an alternating current (AC) or vice versa. The power module may be implemented by major techniques such as the module integration design technique, manufacturing process technique, feature test, reliability evaluation technique and the like of the power semiconductor device and those of a packaging material, and may be required to be operated in a harsh environment such as a high temperature environment or a strong vibration environment. Accordingly, it is required for the power module to be highly durable and reliable.

FIG. 1 is a view showing a conventional power module.

Referring to FIG. 1, a conventional power module 100 may include a power semiconductor 120, a direct bond copper (DBC) substrate 110, a molding part 101, a signal 130, and a resistor 150.

The DBC substrate 110 may include an upper substrate 111 having a pattern, a lower substrate 115, a base part 113, and a ceramic substrate 150 insulating the upper substrate 111 and the lower substrate 115 from each other. The power semiconductor 120 and the signal 130 may be bonded to the upper substrate 111. The molding part 101 may surround and protect the power semiconductor 120, the DBC substrate 110, the signal 130, and the resistor 150.

The power module having a high power density may use the plurality of power semiconductors 120 provided in parallel with each other. To control the plurality of power semiconductors 120 provided in parallel with each other, the resistor 150 or a chip (not shown) having a built-in resistor may be disposed between the signal 130 and the power semiconductor 120.

However, a pattern may be additionally formed on the upper substrate 111 to dispose the resistor 150. Accordingly, the conventional power module may have an increased volume and a higher manufacturing cost. In addition, when a bonding agent 151 is used to bond the resistor 150 to the upper substrate 111, the bonding agent 151 may melt in a subsequent high temperature process, which may cause a product defect. Accordingly, there is a need for a structure of a power module that does not separately dispose the resistor 150 therein.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An embodiment of the present disclosure is directed to providing a structure of a power module that has a built-in thin film having a resistor component, and a method for manufacturing a power module.

Another embodiment of the present disclosure is directed to providing a structure of a power module that has the minimum volume and higher reliability by eliminating a conventional resistor element therefrom, and a method for manufacturing a power module.

Another embodiment of the present disclosure is directed to providing a structure of a power module that has a lower manufacturing cost by eliminating a conventional resistor element therefrom, and a method for manufacturing a power module.

Another embodiment of the present disclosure is directed to providing a structure of a power module that allows a design of a thin film having a resistor component to be freely changed, and a method for manufacturing a power module.

Aspects of the present disclosure are not limited to the above-mentioned aspects, and other aspects that are not mentioned here may be obviously understood by those skilled in the art from the following description.

In a general aspect of the disclosure, a power module includes: a circuit board having a metal pattern formed thereon; a terminal coupled to the circuit board and electrically connected to at least a portion of the metal pattern; a power device chip bonded to the circuit board and electrically connected to at least a portion of the metal pattern and the terminal; and a molding part covering the power device chip and the circuit board, wherein the circuit board includes: a base part having an insulating material; a pattern layer disposed on at least one of an upper surface and a lower surface of the base part and providing the metal pattern; and a thin film resistor having a predetermined circuit pattern connecting the metal patterns disposed on the base part to each other.

The thin film resistor may be formed by disposing a mask, which has an opening corresponding to the circuit pattern, on the pattern layer, and then sputtering a resistor material on the circuit board through the opening.

A side of the metal pattern may be inclined at an angle for the side of the metal pattern to be exposed in a direction in which the sputtering is performed.

The angle between the side of the metal pattern and the base part may be an obtuse angle.

A width of an opening may include a portion of an upper surface of the metal pattern and a portion of the base part when the opening corresponds to the circuit board. The thin film resistor may include graphite.

In another general aspect of the disclosure, a method for manufacturing a power module of claim 1, the method includes: forming a metal pattern on a circuit board; coupling a terminal to the circuit board and electrically connecting the terminal to at least a portion of the metal pattern; bonding a power device chip to the circuit board and electrically connecting the power device to at least a portion of the metal pattern and the terminal; covering the power device chip and the circuit board with a molding part; disposing a pattern layer on at least one of an upper surface and a lower surface of a base part of the circuit board to provide the metal pattern, the base part comprising an insulating material; and forming a thin film resistor having a predetermined circuit pattern connecting the metal patterns disposed on the base part to each other.

The forming of the thin film resistor may include: preparing a mask having an opening corresponding to the circuit pattern; and disposing the mask on the circuit board and sputtering a resistor material on the circuit board through the opening.

A side of the metal pattern may be inclined at an angle for the side of the metal pattern to be exposed in a direction in which the sputtering is performed.

The angle between the side of the metal pattern and a base part may be an obtuse angle.

A width of an opening may include a portion of an upper surface of the metal pattern and a portion of the base part when the opening corresponds to the circuit board.

The forming of the metal pattern may include etching the pattern layer.

The thin film resistor may include graphite.

The thin film resistor may be directly deposited on the circuit board.

DETAILED DESCRIPTION

Figure 1:
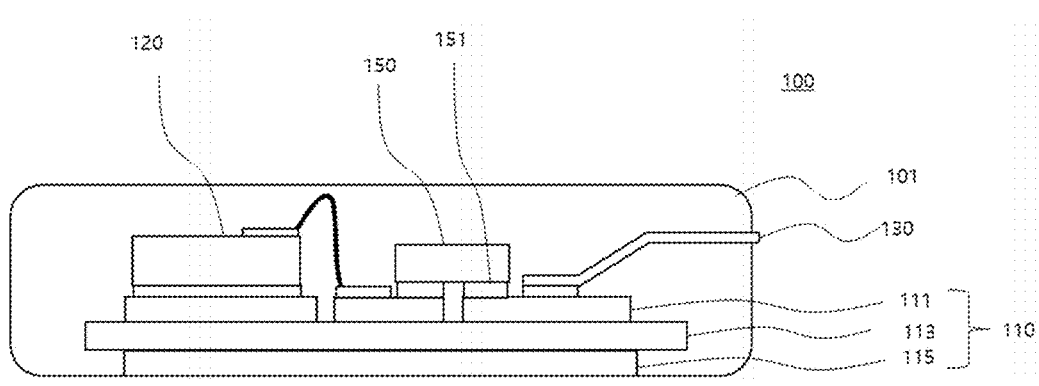
FIG. 1 is a view showing a conventional power module.

Hereinafter, embodiments are described in detail with reference to the accompanying drawings to be easily practiced by those skilled in the art to which the present disclosure pertains. However, the present disclosure may be implemented in various different forms and is not limited to the embodiments described herein. In addition, in the drawings, portions unrelated to the description are omitted to clearly describe the present disclosure, and similar portions are denoted by similar reference numerals throughout the specification.

Throughout the specification, when one part is referred to as being "connected to" another part, one part and another part may be "directly connected to" each other, or may be "electrically connected to" each other with a third part interposed therebetween.

Throughout the specification, when one member is referred to as being positioned "on" another member, one member and another member may be in contact with each other, or a third member may be interposed between one member and another member.

Throughout the specification, "including" one component is to be understood to imply the inclusion of another component rather than the exclusion of another component, unless explicitly described to the contrary. As used throughout the specification, a term of degree "about", "substantially", or the like is used to indicate the number of a stated meaning or its approximation when its manufacturing or material tolerance inherent therein are given. Such a term is used to prevent unscrupulous infringers from unfairly using the present disclosure in which exact or absolute figures are stated to facilitate the understanding of this application. As used throughout the specification, a term of a "step of (doing)" or a "step of~" does not indicate a "step for~".

Hereinafter, the embodiments of the present disclosure are described in detail with reference to the accompanying drawings and the description provided below. However, the present disclosure is not limited to the embodiments described herein, and may also be embodied in another form. The same reference numerals denote the same components throughout the specification.

Figure 2:
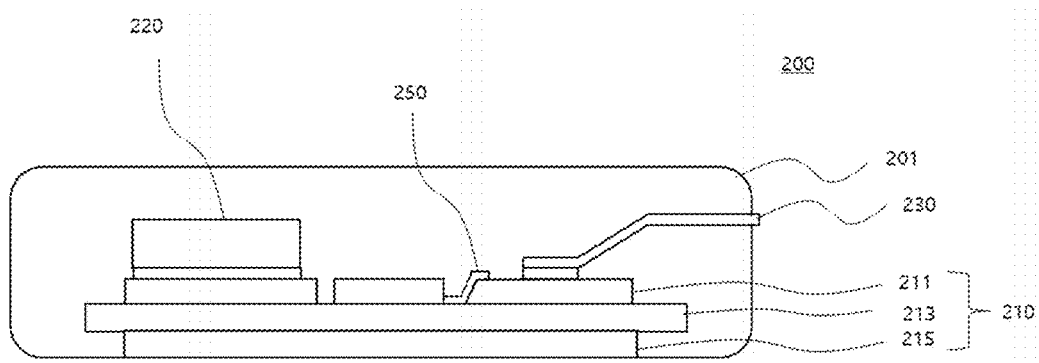
FIG. 2 is a view showing a structure of a power module according to an embodiment of the present disclosure.

Hereinafter, the description describes a structure of a power module 200 according to an embodiment of the present disclosure. FIG. 2 is a view showing the structure of the power module 200 according to an embodiment of the present disclosure. Referring to FIG. 2, the structure of the power module 200 may include a circuit board 210, a thin film resistor 250, a power device chip 220, a terminal 230, and a molding part 201.

A conductive pattern may be formed on the circuit board 210. The power device chip 220 may be installed on the circuit board 210 to be electrically connected to at least a portion of the pattern and the terminal 230 described below. In an example, the power device chip 220 may be bonded to the circuit board 210. The power device chip 220 may have a plurality of power devices bonded in parallel to metal wiring formed on a predetermined substrate 210, and may be installed on the circuit board 210. The circuit board 210 and the power device chip 220 described above are only examples, and the present disclosure may be applied to circuit boards and power device chips provided in various forms.

In an example, the circuit board 210 of the present disclosure may have pattern layers 211 and 215 and a base part 213. The base part 213 may be made of an insulating material. In an example, the base part 213 may be provided as a silicon substrate. The pattern layer 211 or 215 may be disposed on at least one of the upper and lower surfaces of the base part 213 and provide a metal pattern on the circuit board 210. The pattern layer 211 or 215 may be provided as a metal substrate. In an example, the pattern layer 211 or 215 may be made of aluminum or copper.

In an example, the pattern layer 211 or 215 may include the upper substrate 211 and the lower substrate 215. In an example, the metal pattern may be acquired by etching the upper substrate 211.

The thin film resistor 250 may be disposed on the circuit board 210 and have a predetermined circuit pattern connecting the metal patterns to each other. Thin film resistor 250 may replace a conventional resistor bonded to the pattern layer 211 or 215 using a bonding agent. In an example, the thin film resistor 250 may have one side covering the upper and side surfaces of one metal pattern and the other in contact with the other metal pattern. In an example, the thin film resistor 250 may be deposited on the metal pattern and the base part 213 through a sputtering process. The description describes that the thin film resistor 250 is formed through the sputtering process. However, unlike this example, the thin film resistor 250 may also be formed by another technique for coating a thin film on the circuit board 210.

In an example, the thin film resistor 250 may include at least one of a metal, a non-metal, and a composite material having a resistor component. In an example, the thin film resistor 250 may be made of a material including graphite or graphite. Although the thin film resistor 250 is described as including graphite, the thin film resistor 250 may be replaced by a material having high resistivity like graphite. In an example, the thin film resistor 250 may have a thickness of hundreds of nanometers to tens of micrometers.

The terminal 230 may function to connect the circuit board 210 with an external electrical element or transmit a signal. In an example, the terminal 230 may have one side connected to the circuit board 210 and the other side connected to a component such as a capacitor. In an example, the terminal 230 may be bonded to the circuit board 210 by a bonding agent.

The molding part 201 may cover the power device chip 220, the circuit board 210, and a portion of the terminal 230. In an example, the molding part 201 may cover the entire power device chip 220, the entire circuit board 210, and a portion of the terminal 230. The molding part 201 may be made of a polymer material having excellent insulating and protective properties. In an example, the molding part 201 may include an epoxy molding compound (EMC). When the molding part 201 is formed in this way, a component such as the power device chip 220 built in the molding part 201 may be protected by the molding part 201.

Figure 3:
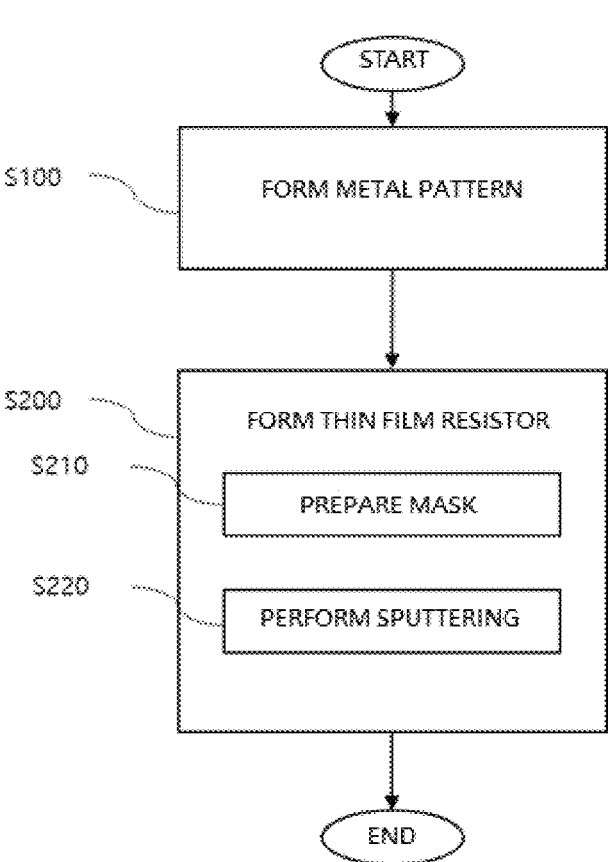
FIG. 3 is a flowchart of a method for manufacturing a structure of a power module according to another embodiment of the present disclosure.

Hereinafter, the description describes a method for manufacturing a structure of a power module 200 according to the present disclosure with reference to FIGS. 3 to 6. FIG. 3 is a flowchart of the method for manufacturing a power module 200 according to another embodiment of the present disclosure.

Referring to FIG. 3, the method for manufacturing a power module 200 may include forming a metal pattern (S100) and forming a thin film resistor (S200).

Figure 4:
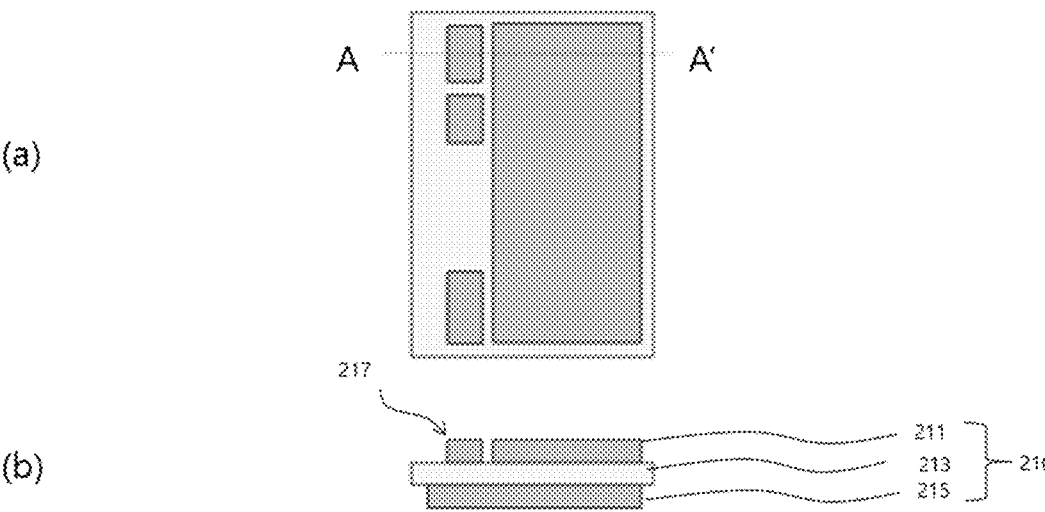
FIGS. 4 to 8 are views sequentially showing the method for manufacturing a power module according to another embodiment of the present disclosure.

FIG. 4, part (a) and part (b) show a circuit board 210 according to another embodiment of the present disclosure. FIG. 4, part (a) is a top view of the circuit board 210, and FIG. 4B is a cross-sectional view taken along line A-A' of FIG. 4, part (a). Referring to FIG. 4, in the forming of the metal pattern (S100), an upper substrate 211 may be etched to form a metal pattern 217. Next, in the forming of the thin film resistor (S200), the metal patterns 217 formed in the forming of the metal pattern (S100) may be connected to each other when necessary. In an example, in the forming of the metal pattern (S100), a thin film resistor 250 having a predetermined circuit pattern 251 for connecting the metal patterns 217 to each other may be formed on the circuit board 210.

Figure 5:
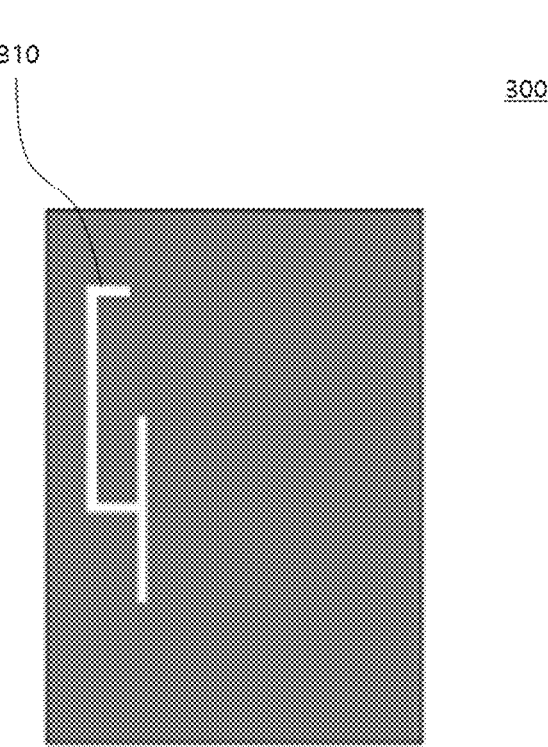

In an example, the forming of the thin film resistor (S200) may include preparing a mask 300 (S210) and performing sputtering (S220). FIG. 5 shows the mask 300 according to another embodiment of the present disclosure.

In the preparing of the mask 300 (S210), the mask 300 having an opening 310 corresponding to the circuit pattern 251 may be prepared as shown in FIG. 5. The thin film resistor 250 may connect one metal pattern 217 to another metal pattern 217. In an example, a width B of the opening 310 (see FIG. 8) may include a portion of an upper surface of the metal pattern 217 and a portion of a base part 213 when disposing the opening 310 to correspond to the circuit board 210 in the forming of the thin film resistor 250. The present disclosure may allow a design of a thin film resistor to be freely changed because the desired circuit pattern 251 may be formed by adjusting the size and shape of the opening 310.

Figure 6:
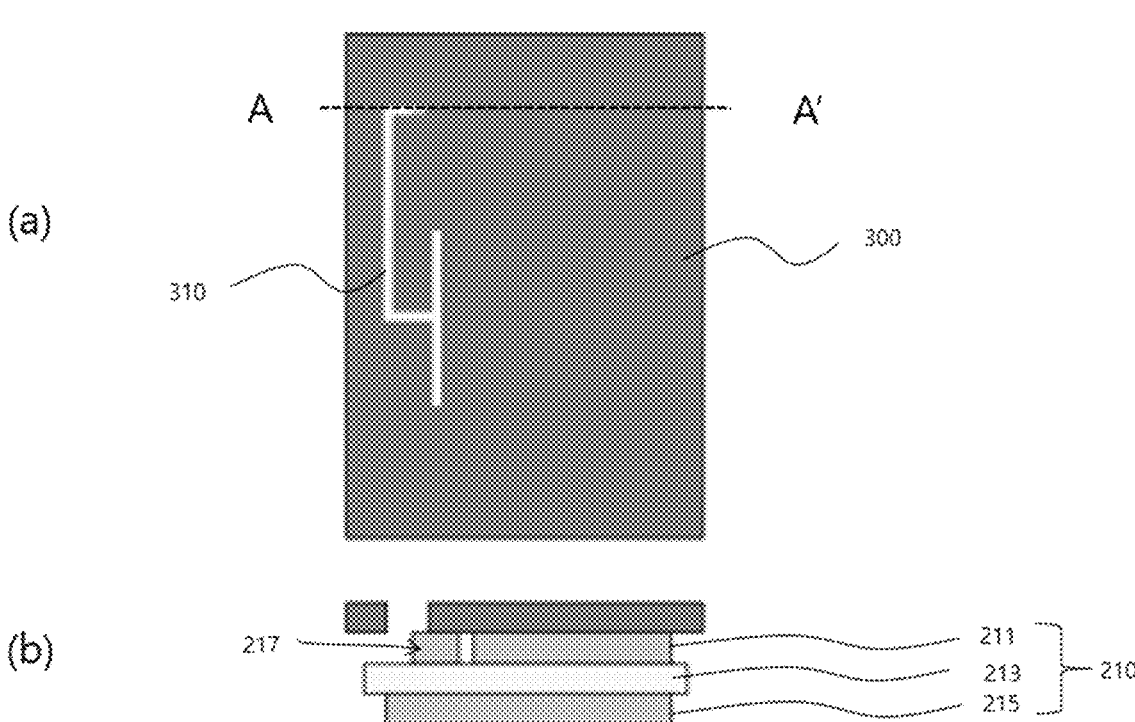

Next, the sputtering may be performed (S220). FIG. 6, part (a) and part (b) show that the mask 300 is disposed to correspond to the circuit board 210. In detail, FIG. 6, part (a) is a top view of the circuit mask 300 and the circuit board 210, and FIG. 6, part (b) is a cross-sectional view taken along line A-A' of FIG. 4A. As shown in FIG. 6, part (a) and part (b), the mask 300 may be disposed on the circuit board 210.

Figure 7:
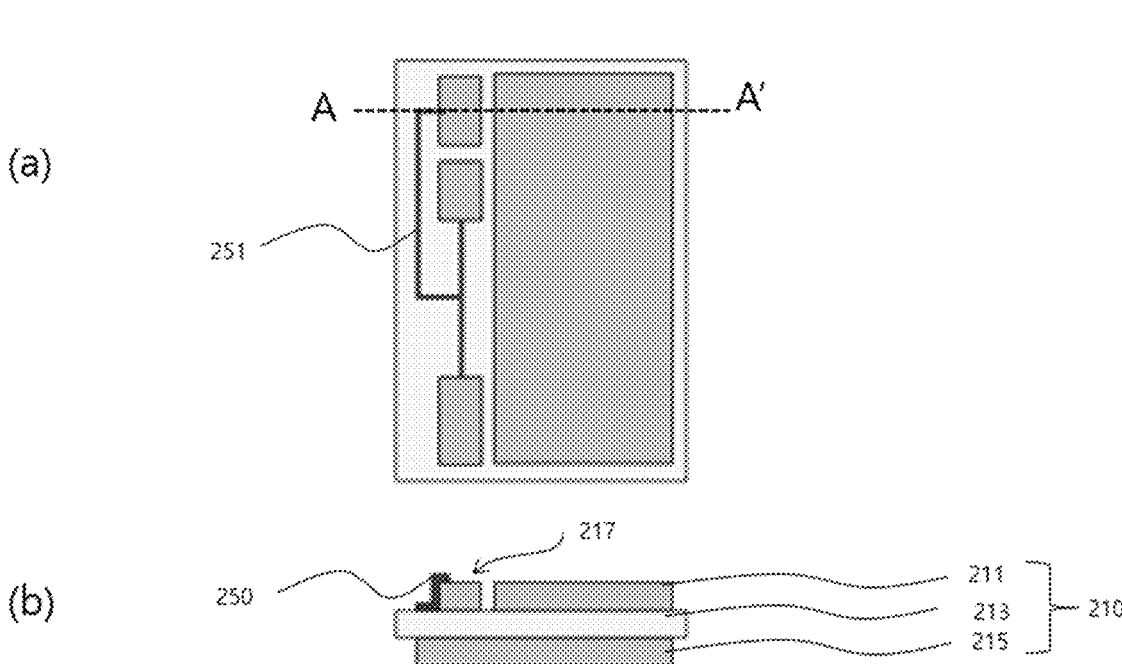

FIG. 7, part (a) and part (b) show that the thin film resistor 250 is deposited on the circuit board 210. In detail, FIG. 7 (part a) is a top view of the circuit board 210, and FIG. 7, part (b) is a cross-sectional view taken along line A-A' of FIG. 4, part (a). A resistor material may be disposed at a position shown in FIG. 6 and deposited on the circuit board 210 through the opening 310. When the sputtering is performed, the resistor material may be deposited by setting the thin film resistor 250 to have a desired thickness. Accordingly, as shown in FIG. 7, the thin film resistor 250 may be formed on the circuit board 210.

Figure 8:
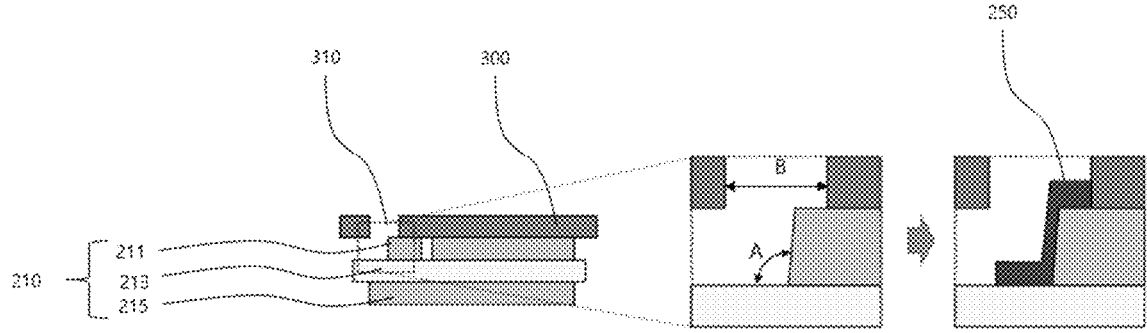

Referring to FIG. 8, in an example, a side of the metal pattern 217 may be inclined at an angle A for the side of the metal pattern 217 to be exposed in a direction in which the sputtering is performed. For example, the angle A between the side of the metal pattern 217 and the base part 213 may be an obtuse angle. Accordingly, the thin film resistor 250 may be deposited on the circuit board 210 without interruption.

The present disclosure may have the minimum volume and the higher reliability by eliminating the conventional resistor element therefrom.

In addition, the present disclosure may have the lower manufacturing cost by eliminating the conventional resistor element therefrom.

In addition, the present disclosure may allow the design of the thin film having the resistor component to be freely changed.

As set forth above, the present disclosure may have the minimum volume and the higher reliability by eliminating the conventional resistor element therefrom.

In addition, the present disclosure may have the lower manufacturing cost by eliminating the conventional resistor element therefrom.

In addition, the present disclosure may allow the design of the thin film having the resistor component to be freely changed.

The above-described embodiments are illustratively provided, and it is apparent to those skilled in the art to which the present disclosure pertains that the present disclosure may be embodied in another specific form without any change in the technical idea or essential feature of the present disclosure. Therefore, it is to be understood that the embodiments described hereinabove are illustrative rather than restrictive in all respects. For example, the components each described as a single type may also be implemented in a distributed manner, and similarly, the components described as being separated from each other may also be implemented in a combined manner.

It is to be understood that the scope of the present disclosure is defined by the claims disclosed below rather than the detailed description provided above, and includes all alternations and modifications derived from the claims and their equivalents.

What is claimed is:

1. A power module comprising:
   a circuit board having a metal pattern formed thereon;
   a terminal coupled to the circuit board and electrically connected to at least a portion of the metal pattern;
   a power device chip bonded to the circuit board and electrically connected to at least a portion of the metal pattern and the terminal; and
   a molding part covering the power device chip and the circuit board,
   wherein the circuit board includes:
   a base part comprising an insulating material;
   a pattern layer disposed on at least one of an upper surface and a lower surface of the base part and providing the metal pattern; and
   a thin film resistor having a predetermined circuit pattern, the thin film resistor being attached to the base part and the pattern layer such that the predetermined circuit pattern connects to the metal pattern disposed on the base part, and
   wherein the thin film resistor is formed by disposing a mask, which has an opening corresponding to the circuit pattern, on the pattern layer, and then sputtering a resistor material on the circuit board through the opening.

2. The power module of claim 1, wherein a side of the metal pattern is inclined at an angle for the side of the metal pattern to be exposed in a direction in which the sputtering is performed.

3. The power module of claim 1, wherein a width of an opening includes a portion of an upper surface of the metal pattern and a portion of the base part when the opening corresponds to the circuit board.

4. The power module of any one of claim 1, wherein the thin film resistor includes graphite.

5. The power module of claim 1, wherein the thin film resistor is directly deposited on the circuit board.

6. The power module of claim 2, wherein the angle between the side of the metal pattern and the base part is an obtuse angle.

7. A method for manufacturing a power module, the method comprising:
   forming a metal pattern on a circuit board;
   coupling a terminal to the circuit board and electrically connecting the terminal to at least a portion of the metal pattern;
   bonding a power device chip to the circuit board and electrically connecting the power device to at least a portion of the metal pattern and the terminal;
   covering the power device chip and the circuit board with a molding part;
   disposing a pattern layer on at least one of an upper surface and a lower surface of a base part of the circuit board to provide the metal pattern, the base part comprising an insulating material; and
   positioning a thin film resistor having a predetermined circuit pattern such that the predetermined circuit pattern connects to the metal pattern disposed on the base part,
   wherein the forming of the thin film resistor comprises:
   preparing a mask having an opening corresponding to the circuit pattern; and
   disposing the mask on the circuit board, on the pattern layer, and sputtering a resistor material on the circuit board through the opening.

8. The method of claim 7, wherein a side of the metal pattern is inclined at an angle for the side of the metal pattern to be exposed in a direction in which the sputtering is performed.

9. The method of claim 7, wherein a width of an opening includes a portion of an upper surface of the metal pattern and a portion of the base part when the opening corresponds to the circuit board.

10. The method of claim 7, wherein the forming of the metal pattern comprises etching the pattern layer.

11. The method of claim 7, wherein the thin film resistor includes graphite.

12. The method of claim 7, wherein the thin film resistor is directly deposited on the circuit board.

13. The method of claim 8, wherein the angle between the side of the metal pattern and a base part is an obtuse angle.

14. The method of claim 8, wherein the thin film resistor includes graphite.

* * * * *